(12) United States Patent
Taneko et al.

(10) Patent No.: US 9,363,885 B1
(45) Date of Patent: Jun. 7, 2016

(54) METHOD OF FABRICATING HEAT DISSIPATING BOARD

(71) Applicant: MEIKO ELECTRONICS CO., LTD., Ayase-shi, Kanagawa (JP)

(72) Inventors: Noriaki Taneko, Ayase (JP); Tsuyoshi Takagi, Ayase (JP); Shukichi Takii, Ayase (JP)

(73) Assignee: Meiko Electronics Co., Ltd., Kanagawa (JP)

( * ) Notice: Subject to any disclaimer, the term of this patent is extended or adjusted under 35 U.S.C. 154(b) by 217 days.

(21) Appl. No.: 14/371,027

(22) PCT Filed: Jun. 12, 2013

(86) PCT No.: PCT/JP2013/066166
§ 371 (c)(1),
(2) Date: Jul. 8, 2014

(87) PCT Pub. No.: WO2014/199456
PCT Pub. Date: Dec. 18, 2014

(51) Int. Cl.
*H05K 3/46* (2006.01)
*H05K 1/02* (2006.01)
*H05K 3/00* (2006.01)

(52) U.S. Cl.
CPC ............ *H05K 1/0204* (2013.01); *H05K 3/0011* (2013.01); *H05K 3/46* (2013.01); *H05K 2201/10416* (2013.01); *H05K 2203/1194* (2013.01)

(58) Field of Classification Search
CPC .............. H05K 1/0204; H05K 3/0011; H05K 2201/10416; H05K 2203/1194
See application file for complete search history.

(56) References Cited

U.S. PATENT DOCUMENTS 3,148,310 A * 9/1964 Feldman ................ H05K 1/112
174/265
3,835,531 A * 9/1974 Luttmer ............... H05K 3/4614
174/263

(Continued)

FOREIGN PATENT DOCUMENTS

CN      201952483 U    8/2011
DE      4220966 A1     1/1994

(Continued)

OTHER PUBLICATIONS

Extended European Search Report, European Patent Application No. 13849969.4, 18 Nov. 2015, 7 pgs.

(Continued)

*Primary Examiner* — Carl Arbes
(74) *Attorney, Agent, or Firm* — Volpe and Koenig, P.C.

(57) ABSTRACT

A method of fabricating a heat dissipating board according to the present invention, includes: a substrate intermediate forming step of forming a substrate intermediate with an insulating layer made of an insulating resin material and a conducting layer made of a conductive material formed on the insulating layer; a through hole forming step of forming a through hole having an approximately cylindrical shape, the through hole penetrating through the substrate intermediate; an inserting step of inserting a heat conducting member to be disposed in the through hole, the heat conducting member being made of a metal and having an approximately cylindrical shape; and a plastically deforming step of plastically deforming the heat conducting member to be secured in the through hole. Prior to the inserting step, an annealing step of annealing the heat conducting member is performed.

2 Claims, 4 Drawing Sheets

(56) References Cited

U.S. PATENT DOCUMENTS

| | | | | |
|---|---|---|---|---|
| 4,050,756 | A * | 9/1977 | Moore | G04G 17/06 |
| | | | | 174/254 |
| 4,644,101 | A * | 2/1987 | Jin | G06F 3/045 |
| | | | | 178/18.05 |
| 4,761,871 | A * | 8/1988 | O'Connor | B29C 65/562 |
| | | | | 156/92 |
| 5,401,911 | A * | 3/1995 | Anderson | H05K 3/4046 |
| | | | | 100/295 |
| 7,367,116 | B2 * | 5/2008 | Yoshino | H05K 3/4038 |
| | | | | 29/830 |
| 7,662,708 | B2 * | 2/2010 | Fork | B82Y 30/00 |
| | | | | 257/738 |
| 7,999,193 | B2 * | 8/2011 | Fukase | H05K 3/445 |
| | | | | 174/262 |
| 2004/0026122 | A1 | 2/2004 | Hayashi et al. | |

FOREIGN PATENT DOCUMENTS

| | | |
|---|---|---|
| JP | H6-45719 A | 2/1994 |
| JP | 2002-344101 A | 11/2002 |
| JP | 2010-263003 A | 11/2010 |
| JP | 2011-91115 A | 5/2011 |

OTHER PUBLICATIONS

Chinese Office Action with English concise explanation, Chinese Patent Application No. 201380004053.4, Jun. 30, 2015, 9 pgs.

* cited by examiner

METHOD OF FABRICATING HEAT DISSIPATING BOARD

TECHNICAL FIELD

The present invention relates to a method of fabricating a heat dissipating board used for, for example, electric control equipment for vehicles, household appliances, LED components, or industrial equipment.

BACKGROUND ART

Semiconductor devices in electrical circuits tend to increase in heat generation amount since the semiconductor devices become to have high density and high current. In particular, semiconductors using Si cause malfunction and a failure at an ambient temperature of 100° C. or more. The heat generating components like such semiconductor devices or similar devices include, for example, a switching element such as an Insulated Gate Bipolar Transistor (IGBT) and an Intelligent Power Module (IPM).

To effectively cool the heat generating components, a heat dissipating board with a heat dissipating path is employed. The heat dissipating path is formed on an opposite side from a mounting surface of components at the substrate. Specifically, heat generated from the heat generating component is conducted to a back surface side of the substrate (the opposite side from a component mounting surface (the mounting surface) and the back surface side is cooled with a heat sink or a similar component.

As a method of forming the heat dissipation path, for example, a heat conducting member made of metal of high thermal conductivity (Cu, Al, or a similar element) is disposed in a through hole formed at the substrate. The heat conducting member is secured in the through hole. The metal is secured to the through hole by close-fitting using press-fit and elastic deformation, bonding with an adhesive or a solder, or a similar method (see, for example, Patent Literature 1). The heat generating component is heat dissipated as follows. The heat conducting member is coupled to the heat generating component and the heat generated from the component is heat dissipated to the outside via the heat conducting member (for example, a pillar-shaped copper).

CITATION LIST

Patent Literature
Patent Literature 1: Japanese Unexamined Patent Application Publication No. 2010-263003 (JP2010-263003A).

SUMMARY OF THE INVENTION

Technical Problem
However, if the heat conducting member is secured in the through hole by press fit, stress is generated due to the press fit. This may generate a crack in prepreg (a composite material made of glass cloth and epoxy resin) that forms an insulating layer of the substrate.

If the heat conducting member is secured in the through hole by elastic deformation, the diameter of the heat conducting member is configured smaller than the diameter of the through hole when inserting the heat conducting member in the through hole. After the insertion, the heat conducting member is plastically deformed by pressurization for fixation. At this time, if center positions of the heat conducting member and the through hole are not concentric, a gap may be generated there between. If a large pressure is applied to generate elastic deformation of the heat conducting member, an amount of elastic deformation of the heat conducting member spreading in a radial direction is not always the same. This also may generate a gap between the heat conducting member and the through hole. The presence of such gap may result in a failure due to percolation of a solder employed for mounting the heat generating component. Since a strong stress is applied to the substrate at a part without a gap, this may break the insulating layer.

The present invention is made accommodating the above-described conventional techniques. An object of the present invention is to provide a method of fabricating a heat dissipating board where the substrate is not broken and a crack is not generated due to stress from the heat conducting member even if the heat conducting member is plastically deformed to be secured in the through hole.

Solution to the Problem

To achieve the above-described object, the present invention provides a method of fabricating a heat dissipating board. The method includes: a substrate intermediate forming step of forming a substrate intermediate with an insulating layer made of an insulating resin material and a conducting layer made of a conductive material on the insulating layer; a through hole forming step of forming a through hole having an approximately cylindrical shape, the through hole penetrating through the substrate intermediate; an inserting step of inserting a heat conducting member to be disposed in the through hole, the heat conducting member being made of a metal and having an approximately cylindrical shape; and a plastically deforming step of plastically deforming the heat conducting member to be secured in the through hole, wherein prior to the inserting step an annealing step of annealing the heat conducting member is performed.

Preferably, the plastically deforming step is performed by disposing a support plate at one side of the substrate intermediate so as to obstruct the through hole and then pressing and contacting a pressure piece against a pressing surface of the heat conducting member from another side of the substrate intermediate, wherein a pressure with the pressure piece is smaller than a compressive breaking stress of the insulating layer in a direction perpendicular to a penetration direction of the through hole.

Preferably, when the heat conducting member is inserted into the through hole in the inserting step, a gap of 100 μm or less is formed between an outer peripheral surface of the heat conducting member and an inner wall surface of the through hole, and the heat conducting member has a volume of 100% to 110% with respect to a spatial volume in the through hole.

Preferably, when the pressure piece is brought in pressure contact with the heat conducting member in the plastically deforming step, the pressure piece falls within a range of an outer edge of the pressing surface.

Advantageous Effects of the Invention

According to the present invention, prior to the inserting, annealing is performed. The annealing preliminarily anneals the heat conducting member. This can eliminate internal stress of a thermally conductive material. Annealing the heat conducting member can reduce proof stress. Accordingly, in the plastically deforming step, the heat conducting member can be set so as to be plastically deformed at a pressure at which the substrate intermediate is not broken. This allows the heat conducting member to be plastically deformed without destruction of the substrate intermediate and to be secured in the through hole. Since the proof stress can be set, the size of the heat conducting member when the heat conducting member bulges out by an amount of strain at which elastic deformation starts can be obtained. Therefore, when the heat conducting member is plastically deformed in the plastically deforming step, a gap is not generated at the through hole, thus allowing reliably securing the heat conducting member.

The pressure with the pressure piece in the plastically deforming step is set smaller than a compressive breaking stress of the insulating layer applied in the vertical direction with respect to the penetration direction of the through hole. Thus, even if the pressure is directly transmitted to the insulating layer, a crack or a similar damage is not generated at the insulating layer.

A gap between the heat conducting member before the plastic deformation and the through hole is set to 100 μm or less. Accordingly, the heat conducting member and the through hole are brought in contact with one another in a range within which the heat conducting member equally expands to the outside when pressed. That is, viewed from the pressing direction, the heat conducting member equally expands to the outside while maintaining its circular shape. Further, the volume of the heat conducting member with respect to the spatial volume in the through hole is set to 100% to 110%. With such volume, the heat conducting member and the through holes can be in close contact without a gap reliably.

In the plastically deforming step, when the pressure piece is pressed to contact the heat conducting member, the pressure piece falls within a range of an outer edge of the pressing surface. Accordingly, the pressure with the pressure piece does not directly act on the substrate intermediate. In view of this, destruction of the substrate intermediate can be prevented. Even if the volume of the heat conducting member is small and therefore the whole circumference surface of the heat conducting member does not closely contact the through hole, the pressure piece can be embedded into the heat conducting member, and further the heat conducting member can be radially pressed and expanded. In view of this, the heat conducting member can be reliably secured to the through holes.

DETAILED DESCRIPTION OF EMBODIMENTS

Figure 1:
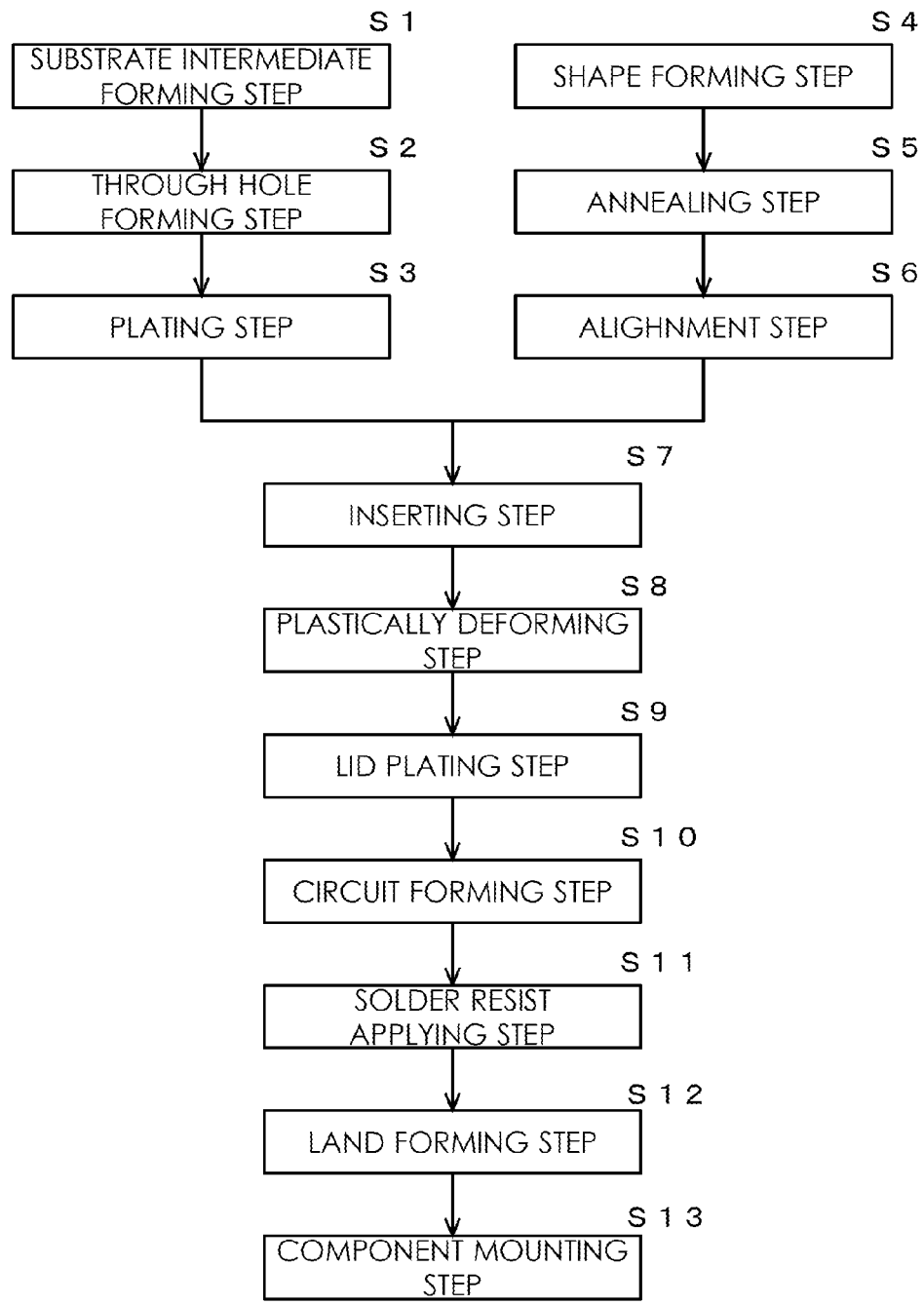
FIG. 1 is a flowchart, showing a method of fabricating a heat dissipating board according to the present invention.

A method of fabricating a heat dissipating board according to the present invention will be described with reference to the flowchart in FIG. 1. Any of a substrate intermediate forming step (Step S1) to a plating step (Step S3) and a shape forming step (Step S4) to an alignment step (Step S6) may be performed first or may be performed simultaneously.

Figure 2:
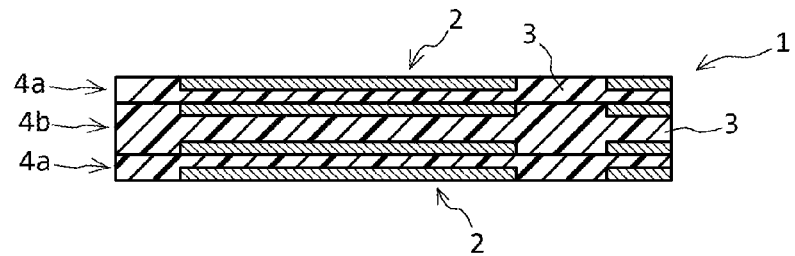
FIG. 2 is a schematic diagram, illustrating the method of fabricating a heat dissipating board according to the present invention in order.

In the substrate intermediate forming step (Step S1), a substrate intermediate 1 illustrated in FIG. 2 is fabricated. In an example of FIG. 2, the substrate intermediate 1 is formed as a so-called four-layered substrate. The substrate intermediate 1 includes a conducting layer 2 made of a conductive material forming a conductive pattern. Four conducting layers 2 are formed via insulating layers 3. In detail, the substrate intermediate 1 includes two of so-called single-sided boards 4a and one so-called double-sided board 4b. The single-sided board 4a includes the conducting layer 2 formed at only one surface of the insulating layer 3 while the double-sided board 4b includes the conducting layers 2 formed at both surfaces of the insulating layer 3. The single-sided board 4a sandwiches the double-sided board 4b, thus multilayer board of four layers are formed by laminating the boards. Here, the insulating layer 3 is made of an insulating resin material, for example, a prepreg. The conducting layer 2 is made of a conductive material, for example, a copper. As long as the insulating layer 3 and the conducting layer 2 are laminated, the number of laminated layers of the substrate intermediate 1 may be appropriately selected.

Figure 3:
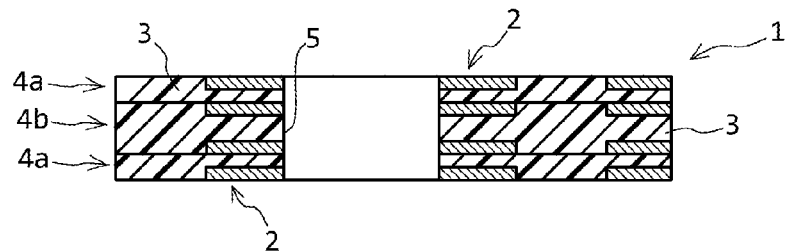
FIG. 3 is a schematic diagram, illustrating the method of fabricating the heat dissipating board according to the present invention in order.

Next, a through hole forming step (Step S2) is performed. In this step, as illustrated in FIG. 3, a through hole 5 penetrating through the substrate intermediate 1 is formed. The through hole 5 is drilled with, for example, a drill and a laser. The hole shape after drilling is approximately cylindrical shape. Accordingly, viewed from a drilled direction, the inner wall surface of the through hole 5 describes a circular shape.

Figure 4:
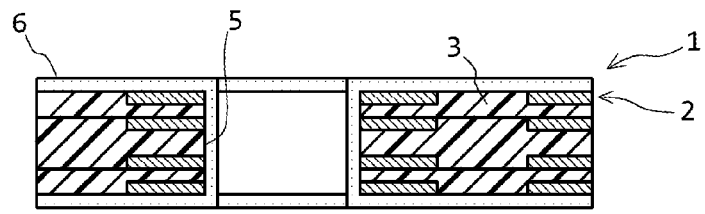
FIG. 4 is a schematic diagram, illustrating the method of fabricating the heat dissipating board according to the present invention in order.

Next, the plating step (Step S3) is performed. In this step, the substrate intermediate 1 on which the through hole 5 is formed is plated. The plating step is performed on the entire surface of the substrate intermediate 1. Accordingly, a plating film 6 deposited by the plating step is formed at both surfaces of the substrate intermediate 1 and the inner wall surfaces of the through hole 5 as illustrated in FIG. 4. Thus, since the plating film 6 covers the entire surfaces of the substrate intermediate I and the through hole 5, even if covered with the plating film 6, the outer shapes of the substrate intermediate 1 and the through hole 5 remain approximately the same even after the plating step. Accordingly, a state where the plating film 6 is interposed at the surfaces of the substrate intermediate 1 and the inner wall surfaces of the through hole 5 may also be referred to as the surfaces of the substrate intermediate 1 and the inner wall surfaces of the through hole 5.

Meanwhile, the shape forming step (Step S4) is performed. This shape forming step is a step for forming the shape of a heat conducting member 7 to be inserted in the through hole 5. That is, in the shape forming step, a board material and a rod material of metal is machined to have an approximately cylindrical shape. For example, a metal plate is punched so as to be an approximately cylindrical shape and a long rod material of approximately cylindrical shape is cut off to a predetermined length appropriately. This allows obtaining the shape of the heat conducting member 7. As a material of the heat conducting member 7, a metallic material with a heat transfer property, for example, a copper is employed.

Next, an annealing step (Step S5) is performed. In this step, the heat conducting member 7 obtained at Step S4 is annealed. Specifically, the heat conducting member 7 is heated in inert gas and then cooled. Here, the heat conducting member 7 after annealing is designed to have 0.2% proof stress of 10 MPa or less. Then, the alignment step (Step S6) is performed. This step positions the plurality of annealed heat conducting members 7 so as to be aligned with the respective through holes 5 of the substrate intermediate 1. In this alignment of the heat conducting members 7, the respective heat conducting members 7 are positioned by being put into supporting materials with concaves at positions corresponding to the positions of the through holes 5. At this time, vibrating the supporting materials automatically puts the heat conducting members 7 into the concaves. This alignment step is performed using a commercially available alignment machine.

Figure 5:
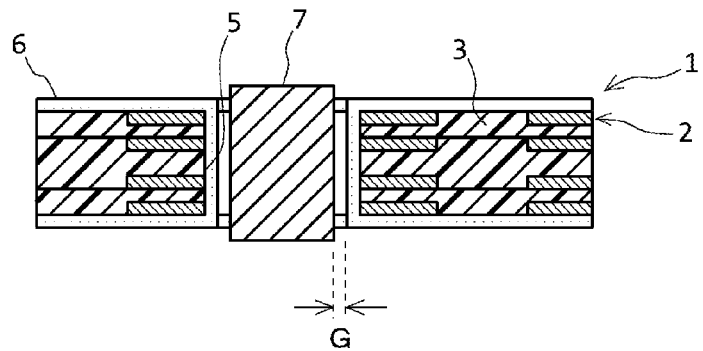
FIG. 5 is a schematic diagram, illustrating the method of fabricating the heat dissipating board according to the present invention in order.

Then, an inserting step (Step S7) is performed. In this step, the heat conducting member 7 is inserted into the through hole 5. Accordingly, as illustrated in FIG. 5, the heat conducting member 7 is installed in the through hole 5. At this time, a gap G of 100 μm or less is formed between the outer peripheral surface of the heat conducting member 7 and the inner wall surface of the through hole 5 (in the example of FIG. 5, the plating film 6 in the through hole 5). Then, the volume of the heat conducting member 7 with respect to the spatial volume in the through hole 5 (in the example of FIG. 5, the spatial volume in the plating film 6 in the through hole 5) is 100% to 110%. Accordingly, since the diameter of the heat conducting member 7 is smaller than the diameter of the through hole 5, the heat conducting member 7 projects from the through hole 5. Since the outer diameter of the heat conducting member 7 is smaller than the inner diameter of the through hole 5 (in the example of FIG. 5, the through hole formed with the plating film 6). Therefore, when inserting the heat conducting member 7, the heat conducting member 7 is not press fitted in the through hole 5. Accordingly, the substrate intermediate 1 is not damaged during insertion.

Figure 6:
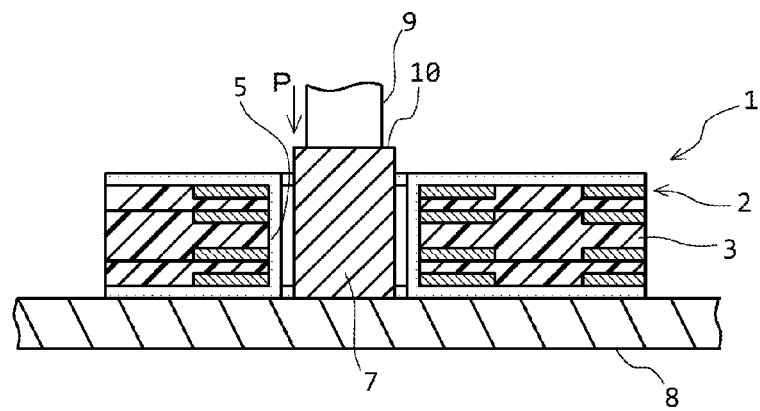
FIG. 6 is a schematic diagram, illustrating the method of fabricating the heat dissipating board according to the present invention in order.

Next, a plastically deforming step (Step S8) is performed. Through the plastically deforming step, the heat conducting member 7 is secured in the through hole 5, and thus a heat dissipating board 15 is fabricated. For plastic deformation of the heat conducting member 7, the substrate intermediate 1 is set to a press. The press includes a support plate 8 on which the substrate intermediate 1 is placed. That is, the support plate 8 is disposed so as to obstruct the through hole 5 at one side of the substrate intermediate 1. With this state, a pressure piece 9 is pressed against the heat conducting member 7 from another side of a side where the support plate 8 is disposed. Specifically, as illustrated in FIG. 6, an end surface at a side where the heat conducting member 7 projects from the through hole 5 acts as a pressing surface 10. The pressure piece 9 is pressed against the pressing surface 10. The pressure piece 9 further presses the heat conducting member 7 in the longitudinal direction of the through hole 5, namely, an arrow P direction.

Figure 7:
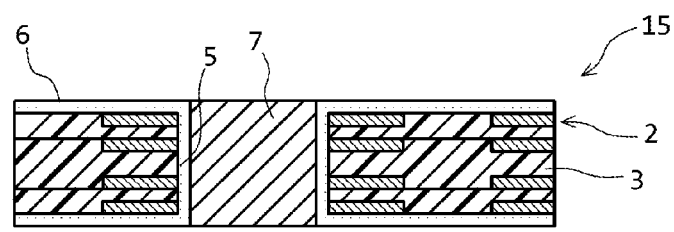
FIG. 7 is a schematic diagram, illustrating the method of fabricating the heat dissipating board according to the present invention in order.

By being pressed with the pressure piece 9, the heat conducting member 7 bumps against the support plate 8. By further being pressed, the heat conducting member 7 is outwardly expanded. That is, the heat conducting member 7 radially expands and contacts the inner wall surfaces of the through holes 5. Pressing the metallic heat conducting member 7 at more than 0.2% proof stress plastically deforms the heat conducting member 7. Thus, as illustrated in FIG. 7, the heat conducting member 7 is secured in close contact with the through hole 5.

At this time, since the annealing step that preliminarily anneals the heat conducting member 7 is performed prior to the above-described inserting step, this eliminates internal stress of a thermally conductive material. Thus, the above-described proof stress can be set. That is, the proof stress of the material that becomes the heat conducting member 7 is reduced by the annealing step. Accordingly, in the plastically deforming step, the heat conducting member 7 can be set so as to be plastically deformed at a pressure at which the substrate intermediate 1 is not broken. This allows the heat conducting member 7 to be plastically deformed without destruction of the substrate intermediate 1 and to be secured in the through hole 5. Since the proof stress can be set by performing the annealing step, the size of the heat conducting member 7 when the heat conducting member 7 bulges out by an amount of strain at which plastic deformation starts can be obtained. Accordingly, the inner diameter of the through hole 5 can be set considering the amount of bulge. Therefore, when the heat conducting member 7 is plastically deformed in the plastically deforming step, a gap is not generated at the through hole 5, thus allowing reliably securing the heat conducting member 7. In particular, setting the above-described gap G narrow, 100 μm or less, the heat conducting member 7 expands radially while maintaining its perfect circle property (a circular shape is equally held viewed from the pressing direction). In the process of equal expansion to the outside, the heat conducting member 7 contacts the through hole 5. To reliably contact the heat conducting member 7 to the inner wall surfaces of the through holes 5, as described above, the volume of the heat conducting member 7 with respect to the spatial volume in the through hole 5 is set to 100% to 110%. With such volume, the heat conducting member 7 and the through hole 5 can be brought in close contact with one another without a gap reliably.

Additionally, regarding setting the gap G to 100 μm or less is described. Assume that the heat conducting member 7 formed of a copper pillar has a 0.2% proof stress of 10 MPa or less. When the heat conducting member 7 is pressed with the pressure piece 9 and compressively deformed, the perfect circle property of the heat conducting member 7 viewed from the pressing direction is deteriorated. At this time, a 100 μm difference is generated from the center to the outer edge of the heat conducting member 7 at the amount of strain of 10%. Accordingly, it is preferred that the amount of strain generated at the heat conducting member 7 in the plastically deforming step be 10% or less. With such amount of strain, if the gap G is 100 μm or more, the perfect circle property is consequently even more collapsed by pressing. This causes the center position of the heat conducting member 7 to be largely displaced from the center positions of the through holes 5 when the heat conducting member 7 is inserted in the inserting step. After the pressing, a part where the heat conducting member 7 and the through hole 5 are not in close contact is generated. Accordingly, it is preferred that the gap G be 100 μm or less. Furthermore, with the gap G of 100 μm or less, even if a gap with the through hole 5 is present after the plastic deformation of the heat conducting member 7, the gap is approximately several tens μm. Therefore, the plating step can sufficiently cover the gap. This allows easily performing after-treatment for just in case (a lid plating step described later).

The pressure with the pressure piece 9 is set smaller than compressive breaking stress of the insulating layer 3 in the vertical direction with respect to the penetration direction (the longitudinal direction) of the through hole 5. With this setting, even if the pressure is directly transmitted to the insulating layer 3, a crack or a similar damage is not generated at the insulating layer 3. Further, when the pressure is set smaller than the compressive breaking stress of the plating film 6 formed at the inner wall surfaces of the through holes 5, the plating film 6 in the through hole 5 is not affected. Specifically, the compressive breaking stress of the plating film 6 is approximately 300 MPa, and the compressive breaking stress of the insulating layer 3 made of a prepreg is 250 MPa to 350 MPa. Accordingly, it is preferred that the pressure with the pressure piece 9 be 250 MPa or less.

As apparent with reference to FIG. 6, the pressure piece 9 falls within the range of the outer edge of the pressing surface 10. That is, during pressing, the pressure piece 9 does not project to the outside from the pressing surface 10. In view of this, even if the pressure piece 9 reaches the surface line of the substrate intermediate 1, the pressure piece 9 does not bump against the surface of the substrate intermediate 1. In other words, the pressure with the pressure piece 9 does not act on the substrate intermediate 1 directly. In view of this, destruction of the substrate intermediate 1 in the plastically deforming step can be prevented. Even if the volume of the heat conducting member 7 is small and therefore the whole circumference surface of the heat conducting member 7 does not closely contact the through hole 5 even when the pressure piece 9 is pressed by being pressed down to the surface line of the substrate intermediate 1, the pressure piece 9 can be embedded in the heat conducting member 7 and further the heat conducting member 7 can be radially pressed and expanded. In view of this, the heat conducting member 7 can be reliably secured to the through holes 5. Pressing with this pressure piece 9 is performed by striking the pressure piece 9 to the heat conducting member 7 by reciprocation. That is, dynamic plastically deforming step is performed on the heat conducting member 7. This dynamic plastically deforming step applies a larger momentary stress than a momentary stress by static plastically deforming step. The other reason that the pressure piece 9 is set so as not to directly contact the substrate intermediate 1 is the following. Such large pressing stress is not acted on the substrate intermediate 1 to prevent the substrate intermediate 1 from breaking.

In the plastically deforming step, the part of the heat conducting member 7 projecting from the through hole 5 is processed so as to be a flat surface with the surface of the substrate intermediate 1 by physical polishing such as buffing.

Figure 8:
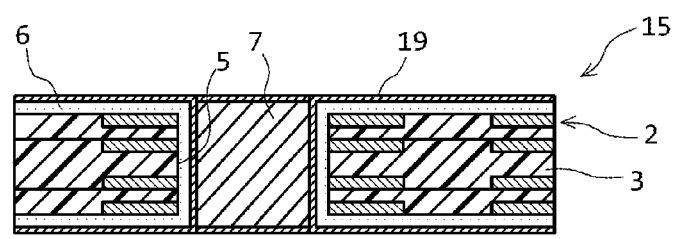
FIG. 8 is a schematic diagram, illustrating the method of fabricating the heat dissipating board according to the present invention in order.

Next, a lid plating step (Step S9) is performed. This step is performed when the heat conducting member 7 and the plating film 6 formed at the inner wall surfaces of the through holes 5 are not in close contact completely in the plastically deforming step as illustrated in FIG. 8, and a gap is provided. Specifically, performing a copper plating step on the heat dissipating board 15 forms a lid plating 19. In this respect, the lid plating 19 is also filled in the gap. This lid plating step ensures complete sealing between the heat conducting member 7 and the through hole 5. This completely prevents a solder for mounting a component in a subsequent process from entering in the through hole 5 through the gap. Preventing immersion of the solder can prevent reduction of an amount of solder for mounting the component. This can also prevent the solder from entering and projecting from the surface at the opposite side, thus flatness at the opposite side surface can also be ensured. The lid plating 19 is removed appropriately. For convenience, the lid plating 19 is omitted in the subsequent drawings.

Figure 9:
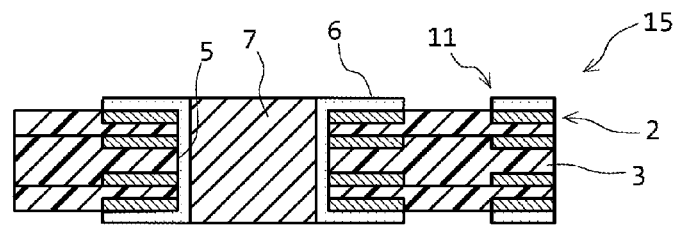
FIG. 9 is a schematic diagram, illustrating the method of fabricating the heat dissipating board according to the present invention in order.

Next, a circuit forming step (Step S10) is performed. In the step, the plating film 6 formed on the surface of the heat dissipating board 15 is removed by, for example, an etching process and a conductive pattern 11 as illustrated in FIG. 9 is formed.

Figure 10:
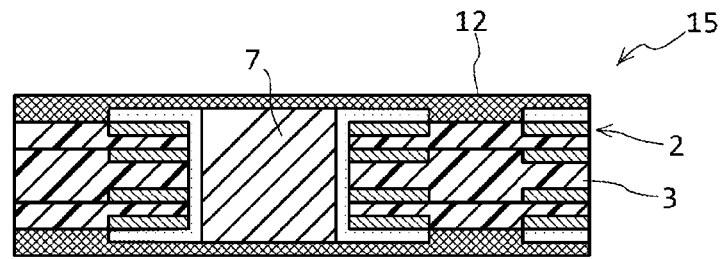
FIG. 10 is a schematic diagram, illustrating the method of fabricating the heat dissipating board according to the present invention in order.

Then, a solder resist applying step (Step S11) is performed. In this step, as illustrated in FIG. 10, solder resists 12 made of insulator are applied over both surfaces of the heat dissipating board 15.

Figure 11:
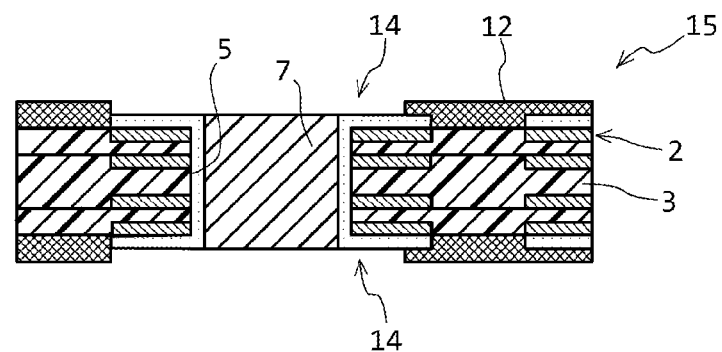
FIG. 11 is a schematic diagram, illustrating the method of fabricating the heat dissipating board according to the present invention in order.

Then, a land forming step (Step S12) is performed. In this step, as illustrated in FIG. 11, a solder resist 12 is partially removed to expose a region where an electric or electronic component 13 is to be mounted as a land 14. The lands 14 are formed corresponding to respective both surfaces of the heat dissipating board 15. The removal of the solder resist 12 takes approximately one hour under 150° C. environment. This temperature exceeds a glass-transition temperature Tg (140° C.) of the insulating layer 3 made of a prepreg; however, as described above, the heat conducting member 7 is annealed. Therefore, strong inner stress does not exist at the heat conducting member 7. Accordingly, a crack is not generated at the insulating layer 3 at the temperature.

Figure 12:
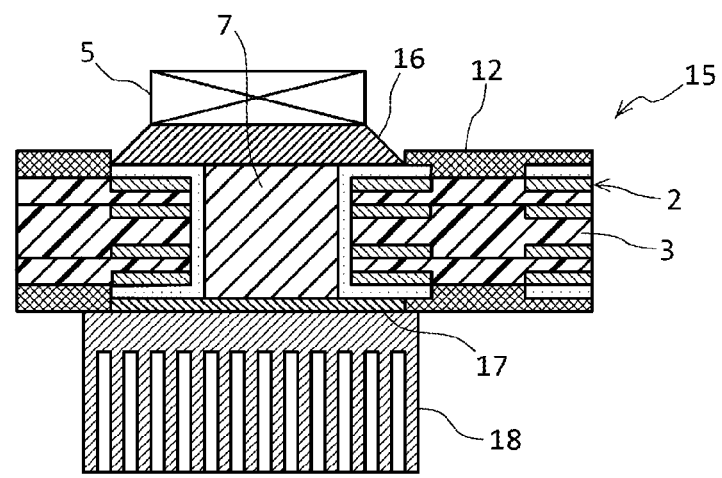
FIG. 12 is a schematic diagram, illustrating the method of fabricating the heat dissipating board according to the present invention in order.

Then, a component mounting step (Step S13) is performed. In this step, as illustrated in FIG. 12, the component 13 is mounted on the land 14 via a solder 16. This thermally couples the component 13 and the heat conducting member 7 via the solder 16. That is, a heat dissipating path for heat generated from the component 13 is ensured. The component 13 and the heat conducting member 7 may be thermally coupled using a heat conducting resin and heat transfer sheet, for example, rather than a solder 16. To the surface of the land 14 at the opposite side of the surface on which the component 13 is mounted, a sheet-shaped heat conducting sheet 17 made of a conductive material is pasted. A heat sink 18 is attached contacting the heat conducting sheet 17.

DESCRIPTION OF REFERENCE NUMERALS AND SYMBOLS 1 substrate intermediate
2 conducting layer
3 insulating layer
4a single-sided board
4b double-sided board
5 through hole
6 plating film
7 heat conducting member
8 support plate
9 pressure piece
10 pressing surface
11 conductive pattern
12 solder resist
13 component
14 land
15 heat dissipating board
16 solder
17 heat conducting sheet
18 heat sink
19 lid plating

What is claimed is:
1. A method of fabricating a heat dissipating board, comprising:

a substrate intermediate forming step of forming a substrate intermediate with an insulating layer made of an insulating resin material and a conducting layer made of a conductive material on the insulating layer;

a through hole forming step of forming a through hole having an approximately cylindrical shape, the through hole penetrating through the substrate intermediate;

an inserting step of inserting a heat conducting member to be disposed in the through hole, the heat conducting member being made of a metal and having an approximately cylindrical shape; and a plastically deforming step of plastically deforming the heat conducting member to be secured in the through hole;

wherein prior to the inserting step an annealing step of annealing the heat conducting member is performed;

wherein the plastically deforming step is performed by disposing a support plate at one side of the substrate intermediate so as to obstruct the through hole and then pressing and contacting a pressure piece against a pressing surface of the heat conducting member from another side of the substrate intermediate; and wherein when the pressure piece is brought in pressure contact with the heat conducting member in the plastically deforming step, the pressure piece falls within a range of an outer edge of the pressing surface, and a diameter of the pressure piece is smaller than a diameter of the through hole to which the heat conducting member is to be secured.

2. The method of fabricating a heat dissipating board according to claim 1, wherein, when the heat conducting member is inserted into the through hole in the inserting step, a gap of 100 µm or less is formed between an outer peripheral surface of the heat conducting member and an inner wall surface of the through hole, and the heat conducting member has a volume of 100% to 110% with respect to a spatial volume in the through hole.

* * * * *